United States Patent [19]

Ando

[11] Patent Number: 4,636,632
[45] Date of Patent: Jan. 13, 1987

[54] PHOTOELECTRIC INPUT APPARATUS FOR DISPLAY SYSTEM

[75] Inventor: Noriyoshi Ando, Kariya, Japan

[73] Assignee: Nippondenso Co., Ltd., Kariya, Japan

[21] Appl. No.: 777,075

[22] Filed: Sep. 17, 1985

[30] Foreign Application Priority Data

Sep. 17, 1984 [JP] Japan .................................. 59-194389

[51] Int. Cl.$^4$ ............................................. G01V 9/04
[52] U.S. Cl. .................................................... 250/221
[58] Field of Search ..................... 250/216, 221, 222.1, 250/578

[56] References Cited

U.S. PATENT DOCUMENTS

| 3,478,220 | 11/1969 | Milroy | 250/221 |
| 4,267,443 | 5/1981 | Carroll et al. | 250/221 |
| 4,384,201 | 5/1983 | Carroll et al. | 250/221 |

Primary Examiner—Eugene R. LaRoche
Assistant Examiner—D. C. Mis
Attorney, Agent, or Firm—Cushman, Darby & Cushman

[57] ABSTRACT

A photoelectric touch input apparatus comprises a frame placed in front of the display surface of a display device, a plurality of light-emitting elements mounted on the frame in a row along one side of a central opening of the frame to produce a plurality of light beams in parallel spaced relationship, a plurality of photosensitive elements mounted on the frame in a row along the opposite side of the opening and aligned with the light-emitting elements to receive the light beams, a transparent flat plate arranged between the display surface and the light beams and resiliently supported on the frame to be moved toward the display surface by pressure of an object touched thereto, a comparison circuit associated with the photosensitive elements to produce a first output signal indicative of the position of the object when it interrupts one of the light beams, a plurality of switches mounted on the frame and associated with the flat plate to produce a plurality of second output signals therefrom in response to movement of the flat plate toward the display surface, and a switching circuit responsive to the first output signal and at least one of the second output signals to produce a control signal for switching over an indication or picture on the display surface to another indication or picture defined by the first output signal.

3 Claims, 4 Drawing Figures

PHOTOELECTRIC INPUT APPARATUS FOR DISPLAY SYSTEM

BACKGROUND OF THE INVENTION

The present invention relates to a photoelectric input apparatus for display systems, and more particularly to a photoelectric touch input apparatus adapted to be placed in front of the display surface of a display device such as a cathode ray tube, a liquid crystal display panel or the like.

Such a conventional photoelectric touch input apparatus as described above comprises a plurality of light-emitting elements arranged in a row along one side of a display surface on the front of a display device to generate a plurality of light beams in parallel spaced relationship in a common plane, a plurality of photosensitive elements arranged in a row along the opposite side of the display surface to receive the light beams from the light-emitting elements, a detecting circuit associated with the photosensitive elements to produce an output signal indicative of the position of an operator's finger or stylus when it interrupts one of the light beams, and switch means responsive to the output signal of the detecting circuit to switch over an indication or picture on the display surface to another indication or picture defined by the position of the operator's finger or stylus. If in use of the photoelectric input apparatus, more than one of the light beams is erroneously broken by an angled approach of the operator's finger or stylus, there will occur an error in identification of the position of the operator's finger or stylus, resulting in a false indication on the display surface.

SUMMARY OF THE INVENTION

It is, therefore, a primary object of the present invention to provide an improved photoelectric input apparatus capable of accurately detecting the position of an operator's finger or stylus without causing any error in identification thereof even when more than one of the light beams is erroneously broked by an angled approach of the operator's finger or stylus.

According to the present invention, the primary object is attained by providing a photoelectric touch input apparatus for a display device which comprises a housing having a frame adapted to be placed in front of the display surface of the display device and defining an opening therein, a plurality of light-emitting elements mounted on the frame in a row along one side of the opening to produce a plurality of light beams in parallel spaced relationship in a common plane, a plurality of photosensitive elements mounted on the frame in a row along the opposite side of the opening and aligned with the light-emitting elements to receive the light beams, a transparent flat plate arranged between the display surface and the light beams and resiliently supported on the frame to be moved toward the display surface by pressure of an object touched thereto, means associated with the photosensitive elements to produce a first output signal indicative of the position of the object when it interrupts one of the light beams, switch means mounted on the frame and associated with the flat plate to produce a second output signal therefrom in response to movement of the flat plate toward the display surface, and control means responsive to the first and second output signals to produce a control signal for switching over an indication or picture on the display surface to another indication or picture defined by the first output signal.

In the actual practices of the present invention, it is preferable that the switch means includes a plurality of circumferentially spaced normally open switches mounted on the frame to produce a plurality of output signals therefrom when closed by engagement with the flat plate, wherein the control means is arranged to produce the control signal in response to the first output signal and at least one of the output signals from the normally open switches. It is further preferable that the transparent flat plate is in the form of a filter.

BRIEF DESCRIPTION OF THE DRAWINGS

Additional objects, features and advantages of the present invention will become more readily apparent from the following detailed description of a preferred embodiment thereof when considered with reference to the accompanying drawings, in which.

DETAILED DESCRIPTION OF THE PREFERRED EMBODIMENT

Figure 1:
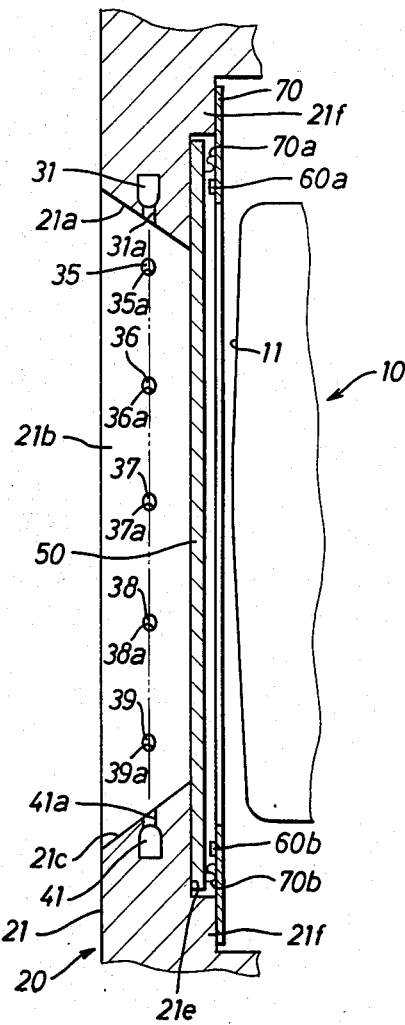
FIG. 1 is a sectional view of a photoelectric touch input apparatus in accordance with the present invention.
Figure 2:
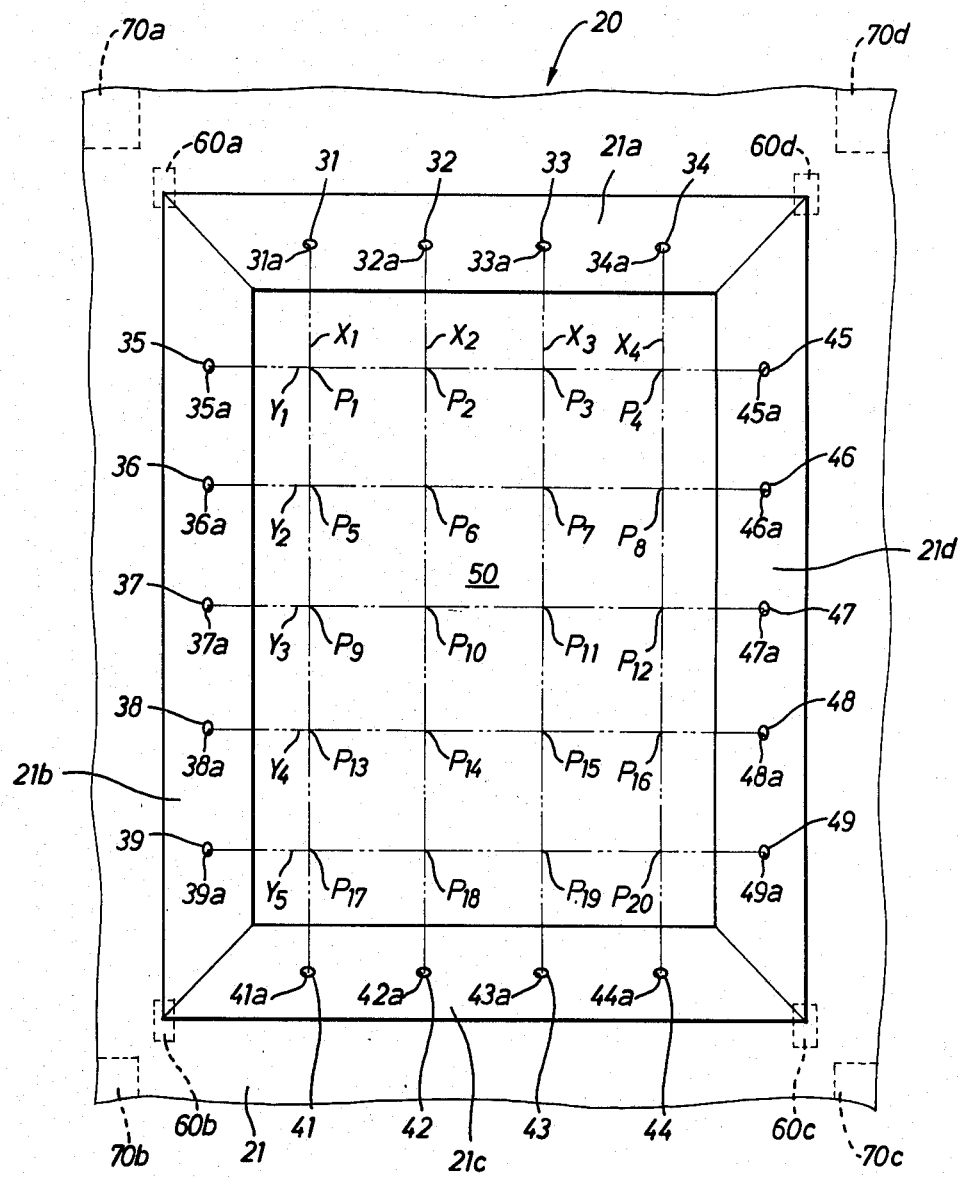
FIG. 2 is a front view of the photoelectric touch input apparatus shown in FIG. 1, illustrating a plurality of intersect points of light beams arranged in parallel spaced relationship in a common plane.

Referring now to the drawings, paricularly in FIGS. 1 and 2, there is illustrated a housing 20 for a photoelectric touch input apparatus in accordance with the present invention. The housing 20 has a rectangular front frame 21 which is adapted to be placed in parallel to a display surface 11 on the front of a display device 10 such as a cathod ray tube or a liquid crystal display panel. The front frame 21 has a central opening which is bounded by a pair of opposed side walls 21b and 21d and a pair of opposed upper and lower walls 21a and 21c. The upper wall 21a of front frame 21 is equipped with four light-emitting elements 31, 32, 33 and 34 such as light-emitting diodes which are laterally equi-spaced and mounted within the upper wall 21a in such a manner that a lens provided for each of the light-emitting elements 31–34 is faced toward the central opening of front frame 21 through respective holes 31a–34a. Thus, the light beams $X_1$, $X_2$, $X_3$ and $X_4$ of elements 31–34 are arranged in parallel spaced relationship in a common plane within the central opening of front frame 21. The left side wall 21b is equipped with five light-emitting elements 35, 36, 37, 38 and 39 such as light-emitting diodes which are vertically equi-spaced and mounted within the left side wall 21b in such a manner that a lens provided for each of the light-emitting elements 35–39 is faced toward the central opening of front frame 21 through respective holes 35a–39a. Thus, the light beams $Y_1$, $Y_2$, $Y_3$, $Y_4$ and $Y_5$ of elements 35–39 are arranged in parallel spaced relationship to extend across the parallel spaced light beams $X_1$, $X_2$, $X_3$ and $X_4$ of elements 31–34 in the common plane thereby to provide a plurality of intersect points $P_1$, $P_2$ ... $P_{19}$, $P_{20}$. In such an arrangement of the light beams, the intersect points $P_1$–$P_{20}$ are arranged to correspond with a plurality of different indications on the display surface 11 of display device 10.

As shown in FIGS. 1 and 2, the lower wall 21c of front frame 21 is equipped with four photosensitive elements 41, 42, 43 and 44 such as photodiodes or phototransistors which are laterally equi-spaced and mounted within the lower wall 21c in such a manner to face toward the central opening of front frame 21 through respective holes 41a–44a. Thus, the photosensitive elements 41–44 are aligned with the light-emitting elements 31–34 to receive the light beams $X_1$–$X_4$ therefrom. The right side wall 21d of front frame 21 is equipped with five photosensitive elements 45, 46, 47, 48 and 49 such as photodiodes or phototransistors which are vertically equi-spaced and mounted within the right side wall 21d in such a manner to face toward the central opening of front frame 21 through respective holes 45a–49a. Thus, the photosensitive elements 45–49 are aligned with the light-emitting elements 35–39 to receive the light beams $Y_1$–$Y_5$ therefrom.

As shown in FIG. 1, the front frame 21 is formed at the rear surface thereof with a frame-shaped recess 21e in which a rectangular filter 50 in the form of a transparent flat plate made of glass or hard synthetic resin is arranged to oppose the display surface 11 of display device 10. Arranged at each corner of the rear surface of rectangular filter 50 are four normally open microswitches 60a, 60b, 60c and 60d and four waved leaf springs 70a, 70b, 70c and 70d which are retained in place by engagement with a frame-shaped retainer plate 70 secured to the rear surface of front frame 21. Thus, the filter 50 is resiliently supported on the front frame 21 to be moved by pressure of an operator's finger or stylus against the leaf springs 70a–70d toward the display surface 11 of display device 10. When the filter 50 is pushed by an operator's finger or stylus at a portion thereof, it is moved against at least one of the leaf springs 70a–70d toward the display surface 11 to close at least one of the microswitches 60a–60d. When released from pressure of the operator's finger or stylus, the filter 50 is moved apart from the display surface 11 by the compressed leaf spring to open the closed microswitch.

Figure 3:
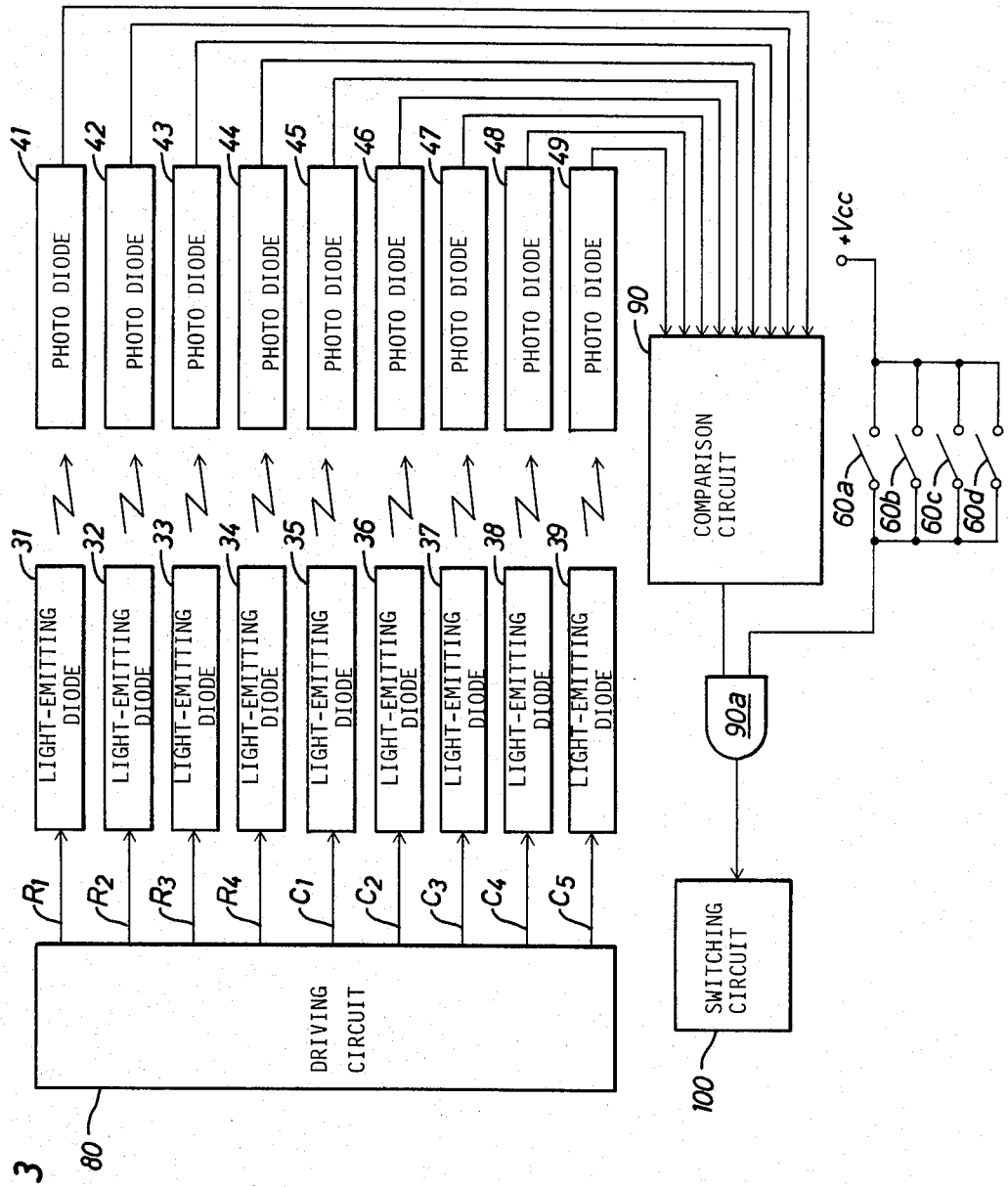
FIG. 3 is a block diagram of an electric control circuit adapted to the photoelectric touch input apparatus.
Figure 4:
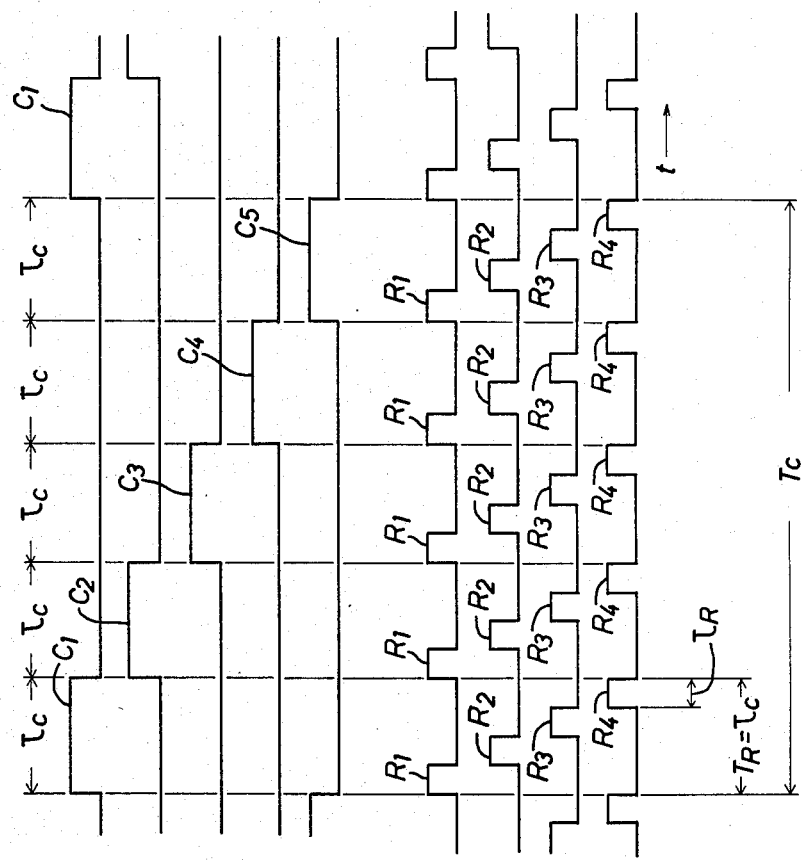
FIG. 4 is a graph illustrating drive pulses generated by a driving circuit for light-emitting in the electric control circuit of FIG. 3.

As shown in FIG. 3, an electric control circuit for the photoelectric touch input apparatus comprises a driving circuit 80 for light-emitting connected to the light-emitting elements 31–39, and a comparison circuit 90 connected to the photosensitive elements 41–49. As shown in FIG. 4, the driving circuit 80 is provided to repeatedly produce a series of drive pulses $C_1$, $C_2$, $C_3$, $C_4$ and $C_5$ and a series of drive pulses $R_1$, $R_2$, $R_3$ and $R_4$. The drive pulses $C_1$–$C_5$ each have a predetermined width $\tau_c$ (for instance, 22ms) and a predetermined duration $T_c$ (for instance, 110ms), while the drive pulses $R_1$–$R_4$ each have a predetermined width $\tau_R$ (for instance, 5.5 ms) and a predetermined duration $T_R$ ($=\tau_c$). Thus, the drive pulses $R_1$–$R_4$ are successively produced within a period defined by the width $\tau_c$ of each of the drive pulses $C_1$–$C_5$. This means that the light-emitting elements 35–39 are successively energized in response to the drive pulses $C_1$–$C_5$ from driving circuit 80 and that the light-emitting elements 31–34 are successively energized in reponse to the drive pulses $R_1$–$R_4$ during energization of the respective light-emitting elements 35–39. The comparison circuit 90 is provided to compare each level of output signals of the photosensitive elements 41–49 with a standard level so as to produce an output signal therefrom when one of the output signals of the photosensitive elements 41–44 and also one of the output signals of the photosensitive elements 45–49 are simultaneously dropped at their levels below the standard level. Thus, the output signal of comparison circuit 90 indicates that one of the intersect points $P_1$–$P_{20}$ of crossed light beams $X_1$–$X_4$ and $Y_1$–$Y_5$ is interrupted by the operator's finger.

As shown in FIG. 3, the normally open microswitches 60a–60d are connected in parallel to each other and connected at their one ends to a DC voltage source +Vcc to produce a high level signal therefrom when closed by inward movement of the filter 50. An AND gate 90a is connected to the other ends of microswitches 60a–60d to produce a high level signal therefrom when applied with the output signal from comparison circuit 90 and at least one of the high level signals from microswitches 60a–60d. The high level signal of AND gate 90a indicates that one of the intersect points $P_1$–$P_{20}$ of the crossed light beams is interrupted by the operator's finger. A switching circuit 100 is connected to the AND gate 90a to produce a control signal therefrom in response to the high level signal from AND gate 90a. The control signal is applied to the display device 10 to switch over an indication or picture on the display surface 11 to another indication or picture defined by the interrupted intersect point.

Assuming that the filter 50 is pushed by an operator's finger at an intersect point $P_{10}$ of the crossed light beams to switch over an indication or picture on the display surface 11, a pair of crossed light beams from the light-emitting elements 32 and 37 are simultaneously interrupted, and subsequently the filter 50 is moved by pressure of the operator's finger against at least one of the leaf springs 70a–70d to close at least one of the microswitches 60a–60d. As a result, each level of the output signals of photosensitive elements 42 and 47 drops below the standard level, and in turn, the comparison circuit 90 produces an output signal indicative of the intersect point $P_{10}$. Simultaneously, a high level signal is produced by the closed microswitch. Thus, the AND gate 90a produces an output signal therefrom in response to the output signal from comparison circuit 90 and the high level signal from the closed microswitch, and subsequently the switching circuit 100 produces a control signal therefrom for switching over the indication or picture on the display surface 11 to another indication or picture defined by the interrupted intersect point $P_{10}$. Even if in such operation, another intersect point adjacent the point $P_{10}$ is erroneously interrupted by an angled approach of the operator's finger, all the microswitches 60a–60d will be maintained in their open positions unless the filter 50 is pushed by the operator's finger. As a result, the AND gate 90a does not produce any output signal due to lack of the high level signal from the microswitches 60a–60d, and the switching circuit 100 is maintained in its deactivated condition. This is effective to avoid a false indication on the display surface 11 caused by the angled approach of the operator's finger or stylus. Additionally, in such operation as described above, the filter 50 is useful to ensure clear visual recognition of a desired position on the display surface 11 of display device 10.

In the actual practices of the present invention, the microswitches 60a–60d may be connected to the driving circuit 80 so that energization of the driving circuit 80 is effected in response to the high level signal from the closed microswitch. In such a modification, the driving circuit 80 is normally maintained in its deenergized condition to be energized only when the filter 50 is pushed by an operator's finger or stylus to switch over an indication or picture on the display surface 11. This is useful to prohibit unnecessary operation of the photoelectric touch input apparatus and to avoid unnecessary consumption of the electric power. Alternatively, the normally open microswitches 60a–60d may be replaced with a plurality of normally closed microswitches which are connected to the AND gate 90a throught an inverter. Furthermore, the normally open microswitches 60a–60d may be replaced with a plurality of photocouplers which are cooperable with a projection formed on each corner of the filter 50. In another modification of the present invention, the light-emitting elements 31–34 (or 35–39) and the corresponding photosensitive elements 41–44 (or 45–49) may be eliminated.

Having thus described the preferred embodiment of the invention, it should be understood that numerous structural modifications and adaptations may be resorted to without departing from the spirit of the invention.

What is claimed is:

1. A photoelectric touch input apparatus for a display device such as a cathod ray tube, a liquid crystal display panel or the like, comprising:
    a housing having a frame adapted to be placed in front of the display surface of said display device and defining an opening therein;
    a plurality of light-emitting elements mounted on said frame in a row along one side of said opening to produce a plurality of light beams in parallel spaced relationship in a common plane;
    a plurality of photosensitive elements mounted on said frame in a row along the opposite side of said opening and aligned with said light-emitting elements to receive the light beams;
    a transparent flat plate arranged between the display surface of said display device and said light beams and resiliently supported on said frame to be moved toward the display surface by pressure of an object such as an operator's finger touched thereto;
    means associated with said photosensitive elements to produce a first output signal indicative of the position of said object when it interrupts one of the light beams;
    switch means mounted on said frame and associated with said transparent flat plate to produce a second output signal therefrom in response to movement of said flat plate toward the display surface; and
    control means responsive to the first and second output signals to produce a control signal for switching over an indication or picture on the display surface of said display device to another indication or picture defined by the first output signal.

2. A photoelectric touch input apparatus as recited in claim 1, wherein said switch means includes a plurality of circumferentially spaced normally open switches mounted on said frame to produce a plurality of output signals therefrom when closed by engagement with said flat plate, and wherein said control means is arranged to produce said control signal in response to the first output signal and at least one of the output signals from said normally open switches.

3. A photoelectric touch input apparatus as recited in claim 1, wherein said transparent flate plate is in the form of a filter.

* * * * *